United States Patent
Wu et al.

(10) Patent No.: US 10,115,785 B1
(45) Date of Patent: Oct. 30, 2018

(54) MEMORY CELLS AND DEVICES

(71) Applicant: Xerox Corporation, Norwalk, CT (US)

(72) Inventors: Jin Wu, Pittsford, NY (US); Lin Ma, Pittsford, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 15/611,732

(22) Filed: Jun. 1, 2017

(51) Int. Cl.
*H01L 27/12* (2006.01)
*C08J 7/04* (2006.01)
*H01L 49/02* (2006.01)
*C09D 161/24* (2006.01)
*C08G 14/02* (2006.01)
*H01L 27/11507* (2017.01)
*H01L 27/10* (2006.01)

(52) U.S. Cl.
CPC .............. *H01L 28/60* (2013.01); *C08G 14/02* (2013.01); *C08J 7/047* (2013.01); *C09D 161/24* (2013.01); *H01L 27/101* (2013.01); *H01L 27/11507* (2013.01); *H01L 27/1203* (2013.01); *C08J 2367/02* (2013.01); *C08J 2461/24* (2013.01)

(58) Field of Classification Search
CPC ... H01L 33/56; C97D 487/04; C08G 2190/00; C08G 59/50; C08G 77/388; C08K 5/3445; C08L 47/00; C08L 75/04; C09J 163/00; G11B 7/242; Y10T 428/31573
See application file for complete search history.

(56) References Cited

U.S. PATENT DOCUMENTS

| | | | | |
|---|---|---|---|---|
| 3,347,724 A | * | 10/1967 | Schneble, Jr. | H05K 3/184 106/1.25 |
| 4,079,284 A | * | 3/1978 | Fanshawe | H05K 1/184 29/832 |
| 4,332,586 A | * | 6/1982 | North | D06M 15/423 528/245 |
| 9,412,705 B2 | | 8/2016 | Karlsson et al. | |
| 2008/0027196 A1 | * | 1/2008 | Park | C08F 14/22 526/242 |
| 2008/0128682 A1 | * | 6/2008 | Park | G11C 11/22 257/40 |
| 2010/0297356 A1 | * | 11/2010 | Flood | C08G 14/08 427/388.1 |
| 2013/0327250 A1 | * | 12/2013 | Shooshtari | C08L 1/00 106/217.5 |
| 2014/0027662 A1 | * | 1/2014 | Shooshtari | C08L 61/02 252/62 |

FOREIGN PATENT DOCUMENTS

WO 2008082046 * 7/2008 ............ H01L 29/516

* cited by examiner

*Primary Examiner* — Caridad Everhart
(74) *Attorney, Agent, or Firm* — Eugene O. Palazzo

(57) ABSTRACT

Disclosed are memory cells that include a mixture of an acrylic polyol, an alkylene urea-glyoxal resin, and an acid catalyst, and memory devices that contain a plurality of memory cells.

23 Claims, 1 Drawing Sheet

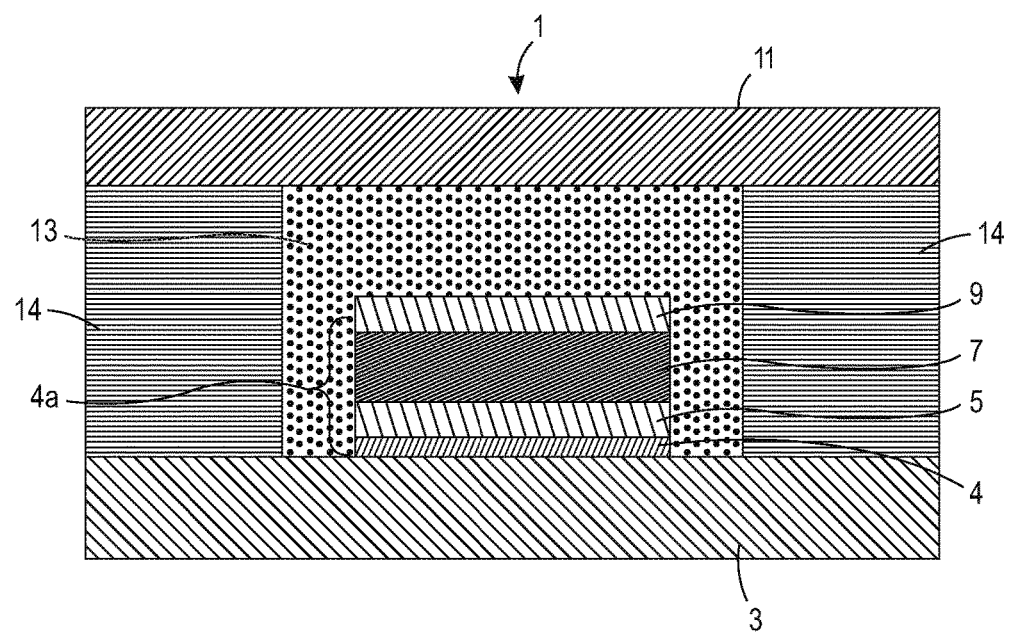

MEMORY CELLS AND DEVICES

The present disclosure is generally directed to a memory cell, and memory devices derived therefrom, comprising a crosslinked mixture of an acrylic polyol, an alkylene urea-glyoxal resin and an acid catalyst.

BACKGROUND

The term "flexible electronics" refers to processes for assembling electronic circuits by making or otherwise providing electronic devices on such flexible plastic substrates as polyimides or certain transparent conductive polyester films, where the circuits can be screen printed on such substrates, or certain other substrates. Flexible electronic assemblies thus may be manufactured with many of the same components used for the preparation of rigid printed circuit boards, where being flexible allows these assemblies to conform to a desired shape, or to flex during their use. Also, flexible electronics can refer to various etching techniques for forming known thin silicon substrates. Flexible printed circuits (FPC), also known as flex circuits, can be prepared by photolithographic technology by, for example, laminating very thin copper strips in between two layers of a polyester polyethylene terephthalate (PET), about 0.05 millimeter thick, and where there is present a base material or substrate of, for example, a polyester, a polyimide, a polyethylene naphthalate, or a polyetherimide, and where a metal foil like copper is used as the conductive element from which the circuit paths are normally etched.

A number of disadvantages are associated with electronic devices, such as for example, they can be costly to fabricate, the layers that are present tend to separate thereby rendering the devices inoperable for their intended purposes causing, for example, some of the layers that contain exposed materials, or protrusions on their surfaces, to adversely affect the characteristics of the layers involved and disrupt the functions of these layers. Moreover, these devices can possess undesirable surface roughness primarily because of the migration of chemical substances, like oligomers, to the electronic device surface, such as a memory cell surface, which in turn degrades the optical and electrical performance of the devices. Many of the known memory devices are prepared by a stepwise sequence that decreases yields, increases cost, and results in unacceptable surface roughness.

There is a need for memory cells and memory devices, and compositions thereof that minimize, or substantially eliminate the disadvantages illustrated herein.

Also, there is a need for devices that contain layers that are free, or substantially free of separation.

There is also a need for compositions that bond the device layers below and above an adhesive layer.

Yet another need resides in providing devices and compositions thereof that possess acceptable surface roughness, and where the surface possesses smooth characteristics.

Additionally, there is a need for adhesive layers that have excellent chemical stability.

Moreover, needed are memory device adhesive layers that are thermally stable, and where the electrodes present, such as a silver electrode, retain their conductivity.

Also, there is a need for thermally cured planarization coatings that have adhesive properties, and which coatings can be permanently attached to substrates and electrodes present in a memory device.

Further, there is desired the preparation of devices that contain an adhesive coating generated by roll to roll processes.

Additionally, there is a need for thermally cured planarization adhesive coatings present on suitable flexible substrates, and which coatings can be applied to the flexible substrates, like polyesters, by roll to roll methods and result in smooth substrate surfaces.

These and other needs and advantages are achievable in embodiments with the processes and compositions disclosed herein.

SUMMARY

Disclosed is a memory cell comprised of a crosslinked mixture of an acrylic polyol, an alkylene urea-glyoxal resin, and an acid catalyst.

Also, disclosed is a memory cell comprising in sequence a flexible substrate layer, an electrically-conductive adhesive layer, a first electrode in electrical contact with said adhesive layer, a second electrode spaced from the first electrode, a ferroelectric memory layer situated between and in electrical contact with each of said first and second electrodes, a buffer layer in contact with said second electrode, and a protective layer in contact with said buffer layer, wherein said adhesive layer comprises a crosslinked mixture of an acrylic polyol, an alkylene urea-glyoxal resin, and an acid catalyst.

Additionally, disclosed is a memory device comprising a plurality of memory cells wherein each memory cell comprises a flexible substrate layer, an adhesive layer, a first electrode in contact with said adhesive layer, a ferroelectric memory layer in contact with said first electrode, a second electrode in contact with said ferroelectric layer, a buffer layer in contact with said second electrode, and a protective layer in contact with said buffer layer, and wherein said adhesive layer is comprised of a crosslinked mixture of an acrylic polyol, an ethylene urea-glyoxal resin, a butylated ethylene urea-glyoxal resin, or mixtures thereof, and an acid catalyst.

Further, disclosed is a thermally cured planarization memory cell coating for polyester substrates, and where roll-to-roll processes are used to fabricate flexible printed electronics, and where the memory cell coating is engineered to have excellent adhesion to a polymer like a polyester substrate, and to an electrode, such as a silver electrode, excellent chemical stability, acceptable thermal stability, and an absence of undesirable negatives impacts on the device electrodes conductivity.

Yet, further disclosed is a memory cell and memory devices thereof comprised of a planarization layer of a crosslinked mixture of an acrylic polyol, an alkylene urea-glyoxal resin, such as an ethylene urea-glyoxal resin, a butylated ethylene urea-glyoxal resin, or mixtures thereof, and an acid catalyst, and which coating imparts smooth characteristics to supporting substrates.

FIGURE

FIG. 1 illustrates exemplary embodiments of the systems, devices, compositions and processes of the present disclosure.

In FIG. 1 there is illustrated a memory cell 1 comprising a flexible substrate 3, a planarization layer 4, which layer can function as an adhesive, situated between the flexible substrate 3 and a first or bottom electrode 5, which can be a patterned electrode, as well as a ferroelectric memory material layer 7, a second or top electrode 9, that can also be a patterned electrode, a buffer layer 13, spacers 14, arranged on the flexible substrate 3, adjacent opposite ends of electrically conductive component layers 4a, where the buffer layer 13 primarily functions to suspend and retain-in-place the protective layer 11 in a spaced relationship relative to the electrically conductive component layers 4a, and where the spacers 14 can, for example, be provided by commercially available strips of tape arranged parallel to the electrodes of the memory device, or by strips or dots, that are printed thereon, and where a plurality of such types and/or forms of memory cells can become operatively and functionally connected electrically to provide an exemplary memory device.

Accordingly, each disclosed memory device comprises an array of the disclosed memory cells, where a polarization state of an individual memory cell can be provided, for example, by applying appropriate voltages to the electrodes contained in the memory cell, or to several memory cells, and which memory cells, as well as various devices derived therefrom, can be generated by such flexible printed electronics.

The disclosed cells, which can be generated by at least one of ink jet printing, gravure printing, screen printing, stamp printing, intaglio printing, offset printing, flexogram printing, laser printing, electrographic printing, wax jet printing, lithography, and the like, can be selected for data storage devices, memory devices, thin film transistors, semiconductors, optical disks, magnetic tapes, and generally devices that retain information for retrieval. Thus, the disclosed flexible memory cells can be referred to as capacitor like structures where the memory substance is a ferroelectric polymer located between two electrodes, and where the memory cell is accessed by conductors linking the electrodes to electronic drivers. Each patterned memory device may contain one individual memory cell, up to several millions of individual cells, such as from about one cell to about 1,000,000 cells arranged, for example, in matrix arrays, and where the layers thereof, such as for example, the planarization layer, the ferroelectric memory layer, and second or top electrode, can be printed using commercially available ink jet systems and processes. Also, the disclosed memory cells and the disclosed memory devices may be printed on packaging materials, labels, tags, and various articles-of-manufacture including, but not limited to, books, bottles, clothes, electronics, paper products, and so forth.

Substrates

Examples of flexible substrates selected for the disclosed memory cells, especially those with a thermal stability of up to at least about 200° C., include various polymers, such as polyesters, and more specifically MYLAR®, polyethylene terephthalate (PET) available from E.I. DuPont Chemical Company, polyethylene naphthalate (PEN), polytetrafluoroethylenes, such as TEFLON®, polystyrenes, polypropylenes, polyethylenes, polyvinyl chlorides, polyvinylidene chlorides, polymethyl methacrylates, polyvinyl acetates, polycarbonates, polyimides, polyamides, polyamideimides, mixtures thereof, and the like.

The substrate can be of various effective suitable thicknesses, such as for example, from about 1 mil to about 10 mils, from about 1 mil to about 5 mils, or from about 2 mils to about 4 mils, as determined with a Permascope, and as determined by other known methods, such as an electron microscope.

Flexible refers, for example, to a material, such as the disclosed substrates that can be bent, or shaped, without damage, that is are capable of significant bending, such as following the curvature of a curved object like a drum, comparatively easily and without breaking and can be easily returned to their original shape, such as flat versus, for example, silicon substrates which are rigid and usually cannot be bent or shaped without damage, that is the silicon substrates can break or crack severely when trying to bend them.

Coatings

Examples of planarization coatings present on the disclosed substrates, which coatings enable smooth substrate surfaces with minimal, or no roughness, possess adhesive characteristics, have excellent thermal stability and improved chemical stability, and avoid adversely impacting the electrodes conductivity in memory cells, and in memory devices include thermally cured compositions, and mixtures thereof comprising an acrylic polyol, a formaldehyde free crosslinker, such as alkylene urea-glyoxal resins and an acid catalyst. Various thicknesses of the coating can be selected for the disclosed memory cells, such as for example, from about 1 to about 15 microns, from about 2 to about 10 microns, from about 2 to about 5 microns, and in embodiments about 2 microns.

Acrylic Polyols

The following percentage values disclosed are percentages by weight unless otherwise indicated. Examples of acrylic polyols present in the disclosed mixtures are available from BASF, and include JONCRYL® 942 (73.2 percent in n-butyl acetate, glass transition temperature ($T_g$) of 26° C., —OH equivalent weight of 400), JONCRYL® 910 (7 percent in methyl amyl ketone, $T_g$ of 9° C., —OH equivalent weight of 600), JONCRYL® 934 (77 percent in n-butyl acetate, $T_g$ of 7° C., —OH equivalent weight of 800), JONCRYL® 500 (80 percent in methyl amyl ketone, $T_g$ of −7° C., —OH equivalent weight of 400), JONCRYL® 550 (62 percent in PM acetate/toluene, 65/35, $T_g$ of 49° C., —OH equivalent weight of 620), JONCRYL® 902 (75 percent in n-butyl acetate, $T_g$ of 20° C., —OH equivalent weight of 500), mixtures thereof and the like; and those acrylic polyols available from Dow Chemical Company, like PARALOID AT-400 (75 percent in methyl amyl ketone, $T_g$ of 15° C., —OH equivalent weight of 652), AT-410 (73 percent in methyl amyl ketone, $T_g$ of 30° C., —OH equivalent weight of 877), AT-63 (50 percent in xylene, $T_g$ of 25° C., —OH equivalent weight of 1305), AT-746 (50 percent in xylene, $T_g$ of 83° C., —OH equivalent weight of 1753), an —OH equivalent weight of from about 300 to about 1,500 together with a Tg of from about −20° C. to about 90° C., mixtures thereof, and the like.

Formaldehyde Free Crosslinkers

Formaldehyde free, or substantially formaldehyde free crosslinking components include, for example, alkylene urea-glyoxal resins, where alkylene contains, for example, from 1 to about 18 carbon atoms, from 2 to about 12 carbon atoms, from 2 to about 6 carbon atoms, or from 2 to about 4 carbon atoms, such as methylene, ethylene, propylene, butylene, pentalene, and other known alkylenes.

Examples of alkylene urea-glyoxal resins selected for the disclosed memory cells and the disclosed memory devices, and which resins are available from Allnex Belgium SA/NV, Brussels, Belgium include ethylene urea-glyoxal resins, propylene urea-glyoxal resins, butylated ethylene urea-glyoxal resins, such as CYMEL® NF3041 prepared in accordance with the following reaction scheme; ethylated ethylene urea-glyoxal resins, ethylated 4,5-dihydroxy ethylene urea-glyoxal resins, mixtures thereof, and the like.

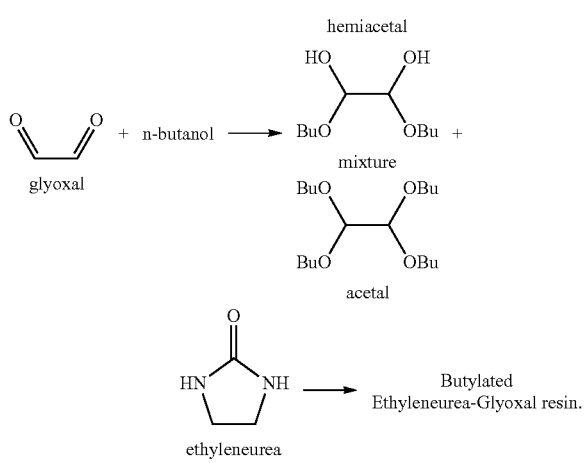

Urea-glyoxal resins can be prepared by providing a mixture AC of an aliphatic alcohol A having at least one hydroxyl group and from about 1 to about 10 carbon atoms, and at least one multifunctional aldehyde C having at least two aldehyde groups —CHO such as glyoxal to generate a mixture (AC)', adding to the mixture (AC)' at least one cyclic urea U, or the educts (starting reactants for the synthesis) to produce the cyclic urea U in situ, which cyclic urea U has at least one unsubstituted amidic —NH— group, and then reacting the mixture thus obtained to form a chemical bond between the nitrogen atom of the at least one unsubstituted amidic —NH— group of the at least one cyclic urea U, and the carbon atom of the at least one aldehyde group —CHO of the multifunctional aldehyde C, which aldehyde group is converted to a hemiacetal group, an acetal group, or mixtures thereof, by reaction with the alcohol A, or by reaction with a polyhydric alcohol.

Aliphatic alcohol examples, which alcohols can be linear, branched, or cyclic, usually have at least one hydroxyl group, and from about one to about 10 carbon atoms, or from 1 to about 8 carbon atoms, such as methanol, ethanol, n-propanol, isopropanol, and the isomeric butanols, particularly n-butanol, and isobutanol, n-hexanol, or 2-ethylhexanol. Polyhydric alcohols, which may be used alone or in a mixture with the monohydric alcohols, include ethylene glycol, 1,2- and 1,3-propane diol, 1,2- and 1,4-butane diol, 1,2- and 1,6-hexane diol, glycerol, trimethylol ethane, and trimethylol propane, pentaerythritol, diglycerol, ditrimethylol ethane, and ditrimethylol propane, mannitol and sorbitol. Also, there can be utilized mixtures of monohydric alcohols, such as a mixture of methanol and isobutanol, mixtures of polyhydric alcohols, or mixtures thereof with monohydric alcohols.

Examples of multifunctional aldehydes C that possess at least two aldehyde groups include aliphatic aldehydes like glyoxal, succinic dialdehyde, glutardialdehyde, and mixtures thereof.

The cyclic ureas U which may be selected have at least one unsubstituted amidic —NH— group, including for example, cycloaliphatic, or bicycloaliphatic compounds having as an element —NH—CO—NH— within a ring structure, the total number of ring atoms being, for example, from about 5 to about 7, like ethylene urea, 1,3-propylene urea, 1,4-butylene urea and tetramethylene urea. For a bicyclic compound, there can be selected glycoluril or acetylene diurea. The cyclic ureas may be substituted by, for example, alkyl groups on at least one of the N—, C— atoms, by hydroxy groups, or by alkoxy groups on the C— atoms of the ring, the alkyl or alkoxy residues containing, for example, from one to about 4 carbon atoms. At least one of the nitrogen atoms should remain unsubstituted to, for example, enable its reaction with the aldehyde, or (hemi) acetal functional molecule.

Cyclic ureas selected may also have hydroxyl groups as substituents on one or more of the carbon atoms, such as 4,5-dihydroxyethylene, or mixtures of at least two of the cyclic ureas like mixtures of ethylene urea and dihydroxyethylene urea. Adducts of these mixtures with glyoxals, which can be at least partially etherified, have excellent reactivity at ambient temperatures. These mixtures can be prepared by reacting the cyclic ureas individually with glyoxal, and then mixing the reaction products. The cyclic ureas may also be formed in situ by the reaction of urea itself, di-ureas, or poly-ureas, which may optionally be substituted having one, two or more than two groups of —NH—CO—NH— in their molecules with multifunctional aldehydes which have more than one aldehyde group in their molecule.

Catalysts

Catalyst examples selected for the disclosed mixtures include p-toluene sulfonic acid (p-TSA) and their blocked forms, such as CYCAT® 4040, CYCAT® 4045, both available from Allnex Belgium SA/NV; K-CURE® 1040; K-CURE® 1040W, NACURE® XP-357 (a blocked p-toluene sulfonic acid in methanol with a pH of 2 to 4, a dissociation temperature of about 65° C.), 2107, 2500, 2501, 2522, 2530, 2547, 2558, all available from King Industries, Inc., Science Road, Conn.; dinonyl naphthalene disulfonic acid (DNNDSA), and their blocked forms, such as CYCAT® 500, all available from Allnex Belgium SA/NV; NACURE® 155, X49-110, 3525, 3327, 3483, all available from King Industries, Inc., Science Road, Conn.; dinonyl naphthalene sulfonic acid (DNNSA) types and their blocked forms, such as NACURE® 1051, 1323, 1419, 1557, 1953, all available from King Industries, Inc., Science Road, Conn.; dodecylbenzenesulfonic acid (DDBSA) and their blocked forms such as CYCAT® 600, available from Allnex Belgium SA/NV, and NACURE® 5076, 5225, 5414, 5528, 5925, all available from King Industries, Inc., Science Road, Conn.; acid phosphates, and their blocked forms such as CYCAT® 296-9, available from Allnex Belgium SA/NV, and NACURE® 4054, XC-C207, 4167, XP-297, 4575, all available from King Industries, Inc., Science Road, Conn.

Specific examples of acid catalysts selected to assist in the curing process and to accelerate the disclosed mixture crosslinking reaction include p-toluene sulfonic acid (p-TSA), dinonyl naphthalene disulfonic acid (DNNDSA), dinonyl naphthalene sulfonic acid (DNNSA), dodecylbenzenesulfonic acid (DDBSA), alkyl acid phosphates, phenyl acid phosphates, oxalic acid, maleic acid, carbolic acid, ascorbic acid, malonic acid, succinic acid, tartaric acid, citric acid, methane sulfonic acid, and mixtures thereof.

Subsequent to curing of the disclosed coating mixture in the presence of a catalyst, which curing can be accomplished quickly, such as for example, from about 5 to about 60 minutes, from about 10 to about 45 minutes, and more specifically, about 10 minutes, there results a crosslinked product, and where the curing can be accomplished by heating at temperatures equal to, or exceeding about 80° C. for extended time periods. More specifically, the curing of the disclosed mixture, in the presence of a catalyst, can be completed at various suitable temperatures, such as for example, from about 80° C. to about 220° C., from about 100° C. to about 180° C., or from about 125° C. to about 140° C. for a period of, for example, from about 1 to about 40 minutes, from about 3 to about 30 minutes, from about 5 to about 20 minutes, from about 10 to about 15 minutes, and yet more specifically, wherein the curing, or drying time is from about 5 to about 10 minutes.

While not desiring to be limited by theory, it is believed that the crosslinking percentage of the mixture of the acrylic polyol, the alkylene urea-glyoxal resin, and the catalyst, subsequent to curing is, for example, as illustrated herein, such as from about 40 percent to about 100 percent, from about 90 percent to about 100 percent, from about 95 percent to about 99 percent, from about 50 percent to about 99 percent, from about 75 percent to about 98 percent, from about 80 percent to about 100 percent, from about 77 percent to about 97 percent, or from about 70 percent to about 90 percent, and which crosslinking percentages were determined by Fourier Transform Infrared (FTIR) Spectroscopy.

The amount of crosslinking ranges for each of the disclosed coating mixture components can vary, and depends, for example, on a number of factors, such as the crosslinking percentage desired.

Generally, the amount of acrylic polyol present in the mixture is, for example, from about 30 percent by weight to about 95 percent by weight, from about 60 percent by weight to about 80 percent by weight, from about 50 percent by weight to about 95 percent by weight, or from about 50 percent by weight to about 80 percent by weight; the amount of the formaldehyde free crosslinker of the alkylene urea-glyoxal is, for example, from about 5 percent by weight to about 70 percent by weight, from about 20 percent by weight to about 60 percent by weight, from about 20 percent by weight to about 40 percent by weight, or from about 5 percent by weight to about 50 percent by weight; and the acid catalyst amount is, for example, from about 0.01 percent by weight to about 10 percent by weight, from about 0.1 percent by weight to about 5 percent by weight, from about 0.5 percent by weight to about 5 percent by weight, from about 0.5 percent by weight to about 3 percent by weight, from about 0.7 percent by weight to about 4 percent by weight, from about 1 percent by weight to about 3 percent by weight, or from about 1 percent by weight to about 5 percent by weight where the weight percents are based on the total solids of the three components present in the coating mixture.

Ferroelectric Layer Components

Examples of ferroelectric memory components for the disclosed memory cells and memory devices can be, for example, organic, such as at least one of an oligomer, a copolymer, a terpolymer, a polymer blend, or mixtures thereof. More specifically, the ferroelectric layer includes known ferroelectric memory components, such as a copolymer of polyvinylidene fluoride and trifluoroethylene (P(VDF-TrFE)), fluorine containing polymers, such as polyvinylidene fluoride (PFVD), copolymers of poly(vinylidene-fluoride trifluoroethylene), copolymers of polyvinylidene fluoride and trifluoroethylene (P(VDF-TrFE)), polyvinylidene cyanide (PVCN) polymers, copolymers, terpolymers, and blends containing polymethylmethacrylates, mixtures thereof, related polymers with polarizable end groups, and also in some instances lead zirconate titanate (PZT), lead titanate, $PbTiO_3$, and lead lanthanum zirconate titanate (PLZT) may be selected for the disclosed ferroelectric layer.

The ferroelectric layer components, such as the disclosed polymers and other known suitable materials, are usually present in an amount of 100 percent, however, suitable amounts of less than 100 percent may be selected, such as for example from about 75 percent to about 99 percent, from about 75 percent to about 95 percent, from about 85 to about 95 percent, with the addition of inert fillers to arrive at a 100 percent amount of components in the ferroelectric layer.

The thickness of the ferroelectric layer is, for example, from about 75 nanometers to about 225 nanometers, from about 125 nanometers to about 200 nanometers, or from about 125 nanometers to about 150 nanometers, as measured with an electron microscope.

Buffer Layer

The buffer layer which primarily functions to partly absorb forces that may be generated by the layers in contact therewith, such as the protective layer, the electrodes, or from outside sources, comprises various suitable polymers, such as silane terminated polymers, polycarbonates, polystyrenes, polyalkylenes, polymethacrylates, polyesters, mixtures thereof, and the like. This layer is, for example, of a thickness of from about 1 (one) micron to about 25 microns, from about 3 microns to about 15 microns, from about 5 microns to about 10 microns, or other suitable thickness, and where the thickness of this layer can be determined with an electron microscope.

The buffer layer components, such as the disclosed polymers and other know suitable materials, are usually present in an amount of 100 percent, however, suitable amounts of less than 100 percent may be selected, such as for example from about 50 to about 99 percent, from about 75 percent to about 95 percent, from about 85 percent to about 95 percent, which together with the addition of inert fillers totals about 100 percent.

Protective Layer

The protective layer, or a protective hard film which is in contact with the buffer layer and adhered thereto by glue, or by clamping, include protective films that are commonly used to protect touch screens of smart phones, such as the polymers disclosed herein, Kapton tape, UV curable varnishes available from Sun Chemical, such as Sun Chemical UV6630) which can be screen printed (as a global layer), and subsequently cured.

The thickness of the protective layer is, for example, from about 1 micron to about 20 microns, from about 5 microns to about 15 microns, or from about 6 microns to about 10 microns as measured with an electron microscope.

Electrodes

Electrodes selected for the disclosed memory cells are usually comprised of a suitable electrically conductive metal, such as silver. However, other known suitable electrode substances may be selected such as copper, gold, aluminum, graphene, carbon nanotubes, graphite and other suitable carbon forms.

Roll-To-Roll Processes

Roll-to-roll (R2R) encompasses a range of processes wherein the disclosed substrates are transferred between two moving rolls, and where these processes have both a time and spatial occurrence with specific customization to achieve the desired process outcomes; see "Nanofabrication Technologies for Roll to Roll Processing Report" from the NIST-NNN Workshop, Sep. 27 to 28, 2011, edited by Jeffery D. Morse, Ph.D., the disclosure of this workshop article being totally incorporated herein by reference. See also U.S. Pat. Nos. 9,076,975 and 9,058,981, both of which are incorporated herein in their entirety.

Roll-to-roll processes are advantageous because of their low unit costs, high volume rates of production, process efficiency through sequential application of successive layers, energy and materials efficiency, and versatility in the types of devices that can be generated.

In the roll-to-roll processes of fabricating the disclosed memory cell, the disclosed planarization layer is first extrusion coated onto the substrate, followed by gravure coating the bottom silver electrode, extrusion coating the ferroelectric layer, gravure coating the top silver electrode, screen coating the buffer layer, and screen coating the protective layer.

The coatings and other layers of the disclosed devices can also be formed by printing them with, for example, ink jet processes.

Specific embodiments will now be described in detail. These examples are intended to be illustrative, and are not limited to the materials, conditions, or process parameters set forth therein. All parts are percentages by weight of solids unless otherwise indicated. The crosslinking percentages were determined by Fourier Transform Infrared (FTIR) Spectroscopy.

EXAMPLE I

Two coating solutions were prepared by mixing JONCRYL® 942 (an acrylic polyol available from BASF), CYMEL® NF3041 (a butylated ethylene urea-glyoxal resin available from Allnex Company), and NACURE® XP-357 (a blocked p-TSA catalyst available from King Industries) in the solvent methylene chloride (20 percent by weight of the solids). There resulted two clear coating solutions with the composition of JONCRYL® 942/CYMEL® NF3041/NACURE® XP-357, 74/25/1 (#1) and 70/29/1 (#2), each in methylene chloride (about 20 percent solids).

The above two prepared coating solutions were each individually draw-bar coated on a 2 mil thick polyethylene naphthalate (PEN) substrate, and subsequently cured at 140° C. for 10 minutes. There resulted crosslinked coating layers, each about 2 microns in thickness, with a coating crosslinking value of about 98 percent for coating (#1) and about 99 percent for coating (#2), and where each of the coated PEN substrates remained flat with no curl as determined by visual observation.

Rough Surface Testers (RSTs) are well known. From Western Michigan University Manufacturing Research Center, one may learn that one such RST, known as The WYKO Rough Surface Tester (RST), also referred to as a Light Interferometer, is a non-contact optical profiler capable of very sensitive 3D surface profilometry and surface roughness characterization. We are further informed that this RST Light Interferometer operates in two measurement modes, namely where one is an optical phase-shifting mode, and the other is a vertical-scanning mode. The optical phase shifting mode is used for reflective, mirror-like samples, and the vertical-scanning mode is used for measurements of samples with rough surfaces. The surface roughness of the above coated substrates were measured by a WYKO surface roughness meter, where $R_a$ is the average of a 20 set of individual measurements of a surface's peaks and valleys, and $R_z$ is the average maximum peak to valley of five consecutive sampling lengths (every 1 micron) as measured by the WYKO surface roughness meter; the results are shown in Table 1. The coated PEN substrates were significantly smoother, the substrates were strongly adhered to the coatings, and the substrates had substantially no roughness characteristics, as compared to the uncoated PEN substrate.

All the following measurements were arrived at by the WYKO surface roughness meter, where the resolution of the instrument has a lower limit of about 1 nanometer, with the upper limit for roughness being 1,000 nanometers or more. The higher the number valve for the WYKO measurements, like 65 and 608, reference Table 1, the rougher the (PEN) substrate surfaces were; the lower the number designation, like 3.2 and 25, for the WYKO surface roughness measurements were, the smoother the (PEN) surfaces were.

TABLE 1

|  | UNCOATED PEN | PEN COATED WITH (#1) | PEN COATED WITH (#2) |
| --- | --- | --- | --- |
| $R_a$ (nm) | 65 | 3.2 | 2.5 |
| $R_z$ (nm) | 608 | 25 | 22 |

To test the adhesion characteristics among the PEN substrates, the above Example I disclosed crosslinked planarization coatings (#1) and (#2), and a silver electrode, there was used an in-house Scotch tape adhesion test, where Scotch tape was placed on each of the coatings (#1) and (#2) present on the PEN substrates, and then the Scotch tape was removed by an individual, resulting in the coating and the substrate being adhered to each other. Also, visual observations evidenced no material on the Scotch tape, that is for example, no silver electrode materials peeled off on the Scotch tape.

EXAMPLE II

There is prepared a memory device comprising a plurality of stacked memory cells by providing a PEN 50 μm thick substrate precoated with the coating (#1), or the coating (#2) of Example I on top of which a 100 nanometers thick (patterned) bottom silver electrode is gravure printed. Subsequently, a 150 nanometers thick (P(VDF-TrFE)) ferroelectric memory material layer is extrusion coated (as a global layer) on the bottom silver electrode layer, and then a 100 nanometers thick (patterned) top silver electrode is gravure printed on the ferroelectric layer. On the top electrode layer, a 10 μm thick buffer layer of a silane-terminated PPG is screen printed. Subsequently, each separate buffer layer is coated with a 5 μm thick protective layer of a UV curable varnish (Sun Chemical UV6630), and subsequently cured.

There will result, it is believed, no negative impacts on the conductivity of the silver electrodes by the disclosed layer coatings (#1) and (#2); the substrate will be smooth, and the layers will adhere to each other for extended time periods.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. A memory cell comprising a flexible substrate layer and a layer comprising a crosslinked mixture of an acrylic polyol, an alkylene urea-glyoxal resin, and an acid catalyst, wherein said acrylic polyol possesses an OH equivalent weight of from about 300 to about 1,500, and a glass transition temperature of from about −20° C. to about 90° C.

2. A memory cell in accordance with claim 1 wherein said alkylene portion of said alkylene urea-glyoxal resin contains from 1 to about 18 carbon atoms.

3. A memory cell in accordance with claim 1 wherein said alkylene portion of said alkylene urea-glyoxal resin is selected from the group consisting of ethylene, propylene, and butylene.

4. A memory cell in accordance with claim 1 wherein said alkylene urea-glyoxal resin is selected from the group consisting of an ethylene urea-glyoxal resin a butylated ethylene urea-glyoxal resin and mixtures thereof.

5. A memory cell in accordance with claim 1 wherein said alkylene urea-glyoxal resin is selected from the group consisting of an ethylated ethylene urea-glyoxal an ethylated 4,5-dihydroxy ethylene urea-glyoxal and mixtures thereof.

6. A memory cell in accordance with claim 1 wherein said alkylene urea-glyoxal resin is a butylated ethylene urea-glyoxal resin generated in accordance with the following reaction scheme

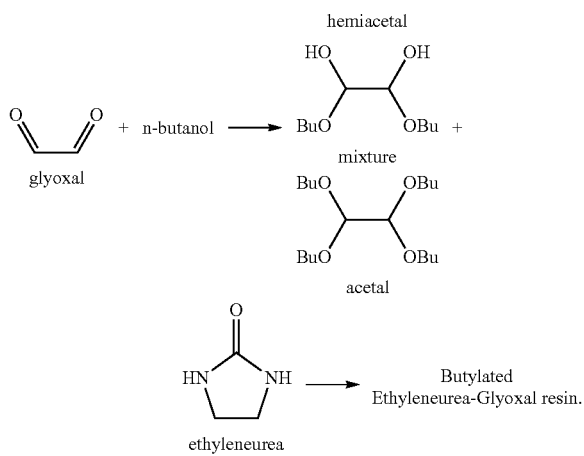

7. A memory cell in accordance with claim 1 wherein said acrylic polyol possesses an OH equivalent weight of from about 400 to about 800, and a glass transition temperature of from about −7° C. to about 49° C.

8. A memory cell in accordance with claim 1 wherein said catalyst is selected from the group consisting of p-toluene sulfonic acid (p-TSA), dinonyl naphthalene disulfonic acid (DNNDSA), dinonyl naphthalene sulfonic acid (DNNSA), dodecylbenzenesulfonic acid (DDBSA), alkyl acid phosphates, phenyl acid phosphates, oxalic acid, maleic acid, carbolic acid, ascorbic acid, malonic acid, succinic acid, tartaric acid, citric acid, methane sulfonic acid, and mixtures thereof.

9. A memory cell in accordance with claim 1 wherein said catalyst is p-toluene sulfonic acid (p-TSA).

10. A memory cell in accordance with claim 1 wherein the amount of acrylic polyol present is from about 30 percent by weight to about 95 percent by weight, the alkylene urea-glyoxal resin amount is from about 5 percent by weight to about 70 percent by weight, and the acid catalyst is present in an amount of from about 0.1 percent by weight to about 5 percent by weight, based on the total solids of the said three components present in said mixture.

11. A memory cell in accordance with claim 1 wherein the amount of acrylic polyol present is from about 60 percent by weight to about 80 percent by weight, the alkylene urea-glyoxal resin amount is from about 20 percent by weight to about 40 percent by weight, and the acid catalyst is present in an amount of from about 1 percent by weight to about 3 percent by weight, based on the total solids of the said three components present in said mixture.

12. A memory cell in accordance with claim 1 wherein the ratio of said acrylic polyol to said alkylene urea-glyoxal to said catalyst is about 74/25/1, or about 70/29/1.

13. A memory cell in accordance with claim 1 wherein said layer comprising said crosslinked mixture of said acrylic polyol, said alkylene urea-glyoxal resin, and said acid catalyst is present as a coating on said flexible substrate.

14. A memory cell in accordance with claim 1 further including a first electrode in contact with said acrylic polyol, said alkylene urea-glyoxal resin, and said acid catalyst crosslinked mixture, a ferroelectric memory layer in contact with said first electrode, a second electrode in contact with said ferroelectric layer, a polymer buffer layer in contact with said second electrode, a protective polymer layer in contact with said buffer layer and spacers arranged on said flexible substrate, and wherein said ferroelectric layer is comprised of a copolymer of polyvinylidene fluoride and trifluoroethylene, copolymers of poly(vinylidenefluoride and trifluoroethylene), and copolymers of polyvinylidene fluoride and trifluoroethylene, and wherein said flexible substrate is selected from the group consisting of polyethylene terephthalate, polyethylene naphthalate, polytetrafluoroethylene, polystyrene, polypropylene, polyethylene, polyvinyl chloride, poly(vinylidene chloride), poly(methyl methacrylate), poly(vinyl acetate), polycarbonate, polychlorotrifluoroethylene, and mixtures thereof.

15. A memory cell in accordance with claim 1 further including obtaining said crosslinked mixture of said acrylic polyol, said alkylene urea-glyoxal resin, and said acid catalyst by curing with heating.

16. A memory cell in accordance with claim 15 wherein said crosslinked value is from about 90 percent to about 100 percent.

17. A memory cell in accordance with claim 1 wherein said flexible substrate layer comprises a polyester, said acrylic polyol, said alkylene urea-glyoxal resin, and said acid catalyst crosslinked mixture is in the configuration of a layer, a first electrode layer situated on said crosslinked mixture layer, a ferroelectric layer situated between said first electrode and a second electrode, a polymer buffer layer present between said second electrode and a protective polymer layer, wherein said ferroelectric layer includes copolymers of polyvinylidene fluoride and trifluoroethylene, fluorine containing polymers of polyvinylidene fluoride, copolymers of poly(vinylidenefluoride and trifluoroethylene), and copolymers of polyvinylidene fluoride and trifluoroethylene, said buffer layer includes a silane terminated polymer, a polycarbonate, a polystyrene, a polyalkylenes, a polymethacrylate, a polyester, or mixtures thereof, said first and said second electrodes are comprised of silver, and wherein said alkylene urea-glyoxal resin is selected from the group consisting of an ethylene urea-glyoxal resin, a butylated ethylene urea-glyoxal resin, an ethylated ethylene urea-glyoxal, and an ethylated 4,5-dihydroxy ethylene urea-glyoxal.

18. A memory cell in accordance with claim 17 wherein said alkylene urea-glyoxal resin is a butylated ethylene urea-glyoxal resin generated in accordance with the following reaction scheme

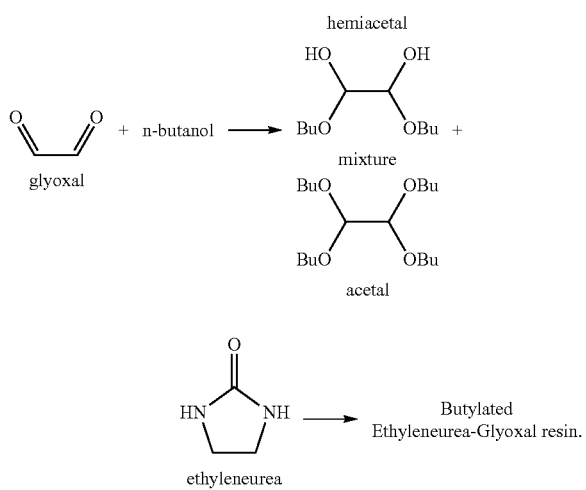

19. A memory cell comprising, in sequence, a flexible substrate layer, an adhesive layer, a first electrode in contact with said adhesive layer, a ferroelectric memory layer situated between said first electrode and a second electrode in contact with said ferroelectric layer, a buffer layer in contact with said second electrode, and a protective layer in contact with said buffer layer, and wherein said adhesive layer is comprised of a crosslinked mixture of an acrylic polyol, an alkylene urea-glyoxal resin, and an acid catalyst.

20. A memory cell in accordance with claim 19 wherein said alkylene urea-glyoxal resin is selected from the group consisting of an ethylene urea-glyoxal resin, a butylated ethylene urea-glyoxal resin, an ethylated ethylene urea-glyoxal, and an ethylated 4,5-dihydroxy ethylene urea-glyoxal.

21. A memory cell in accordance with claim 19 wherein said resin adhesive layer is comprised of a butylated ethylene urea-glyoxal resin generated in accordance with the following reaction scheme.

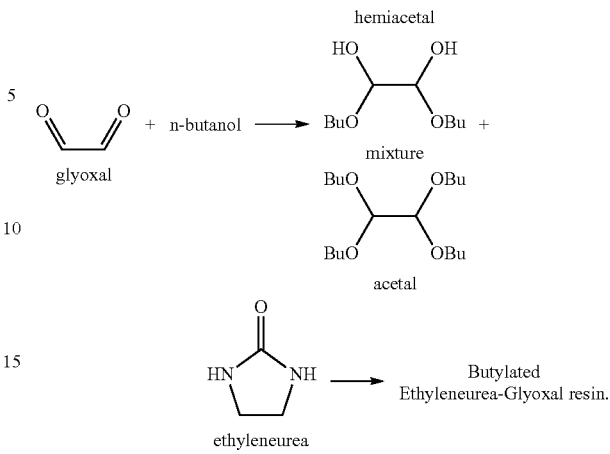

22. A memory device comprising a plurality of memory cells wherein each memory cell comprises a flexible substrate layer, an adhesive layer, a first electrode in contact with said adhesive layer, a ferroelectric memory layer in contact with said first electrode, a second electrode in contact with said ferroelectric layer, a buffer layer in contact with said second electrode, and a protective layer in contact with said buffer layer, and wherein said adhesive layer is comprised of a crosslinked mixture of an acrylic polyol, an ethylene urea-glyoxal resin, a butylated ethylene urea-glyoxal resin, or mixtures thereof, and an acid catalyst.

23. A memory device in accordance with claim 22 wherein the amount of acrylic polyol present is from about 50 percent by weight to about 95 percent by weight, the alkylene urea-glyoxal resin amount is from about 5 percent by weight to about 50 percent by weight, and the acid catalyst is present in an amount of from about 0.5 percent to about 5 percent by weight, based on the total solids, the first electrode is comprised of a metal, the second electrode is comprised of a metal, the ferroelectric memory layer is comprised of a copolymer of polyvinylidene fluoride and trifluoroethylene, copolymers of poly(vinylidenefluoride and trifluoroethylene), and copolymers of polyvinylidene fluoride and trifluoroethylene, and wherein said flexible substrate is selected from the group consisting of polyethylene terephthalate, polyethylene naphthalate, polytetrafluoroethylene, polystyrene, polypropylene, polyethylene, polyvinyl chloride, poly(vinylidene chloride), poly(methyl methacrylate), poly(vinyl acetate), polycarbonate, polychlorotrifluoroethylene, and mixtures thereof.

* * * * *